(12) United States Patent
Stepp et al.

(10) Patent No.: US 6,674,813 B2
(45) Date of Patent: Jan. 6, 2004

(54) INTEGRATED CIRCUIT FOR DETECTING A RECEIVED SIGNAL AND CIRCUIT CONFIGURATION

(75) Inventors: Richard Stepp, München (DE); Hans-Eberhard Kröbel, Muñchen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/026,072

(22) Filed: Dec. 24, 2001

(65) Prior Publication Data

US 2002/0090040 A1 Jul. 11, 2002

Related U.S. Application Data

(63) Continuation of application No. PCT/DE00/01644, filed on May 23, 2000.

(30) Foreign Application Priority Data

Jun. 23, 1999 (DE) .......................... 199 28 794

(51) Int. Cl.$^7$ ................................. H04B 1/18
(52) U.S. Cl. .................... 375/316; 455/161.3
(58) Field of Search .................. 455/161.1, 161.3, 455/182.3, 184.1, 185.1; 375/316, 344, 346, 349

(56) References Cited

U.S. PATENT DOCUMENTS

| | | | | |
|---|---|---|---|---|
| 4,881,273 A | * | 11/1989 | Koyama et al. | 455/161.1 |
| 5,073,975 A | | 12/1991 | Zarabadi et al. | |
| 5,073,976 A | * | 12/1991 | Kennedy | 455/161.3 |
| 5,125,105 A | | 6/1992 | Kennedy et al. | |
| 5,555,451 A | * | 9/1996 | Kennedy et al. | 455/161.2 |
| 6,108,387 A | * | 8/2000 | Kawai | 375/344 |
| 6,198,779 B1 | * | 3/2001 | Taubenheim et al. | 375/316 |

FOREIGN PATENT DOCUMENTS

| | | |
|---|---|---|
| EP | 0 335 141 A2 | 10/1989 |
| EP | 0 415 610 A2 | 3/1991 |
| EP | 0 430 469 A2 | 6/1991 |
| EP | 0 788 226 A1 | 8/1997 |
| JP | 60 096 913 | 5/1985 |

OTHER PUBLICATIONS

Gosch, J.: "IC Gives Car Radio Highly Accurate Digital Tuning", Electronics, Sep. 8, 1983, pp. 11E–12E.
User's Manual for Integrierte Schaltung für Rundfunk–und NF–Anwendungen (Integrated Switch for radio and NF uses), issued by VALVO in 1988, pp.524–529.

* cited by examiner

Primary Examiner—Stephen Chin
Assistant Examiner—Kevin Kim
(74) Attorney, Agent, or Firm—Laurence A. Greenberg; Werner H. Stemer; Ralph E. Locher

(57) ABSTRACT

In order to detect a received signal quickly and reliably, an integrated circuit for detecting a received signal has an intermediate frequency detector which supplies a first search run stop signal if the intermediate frequency lies within a given range. Furthermore, a field-strength comparator is provided which supplies a second search run stop signal if the field-strength of the received signal exceeds a field-strength setpoint value. In addition, a multipath comparator is provided which supplies a third search run stop signal if the multipath signal exceeds a specific multipath setpoint value. The three search run stop signals are logically combined with one another by an AND gate and the result is made available as a static output signal and is provided as an input signal for a microprocessor.

6 Claims, 1 Drawing Sheet

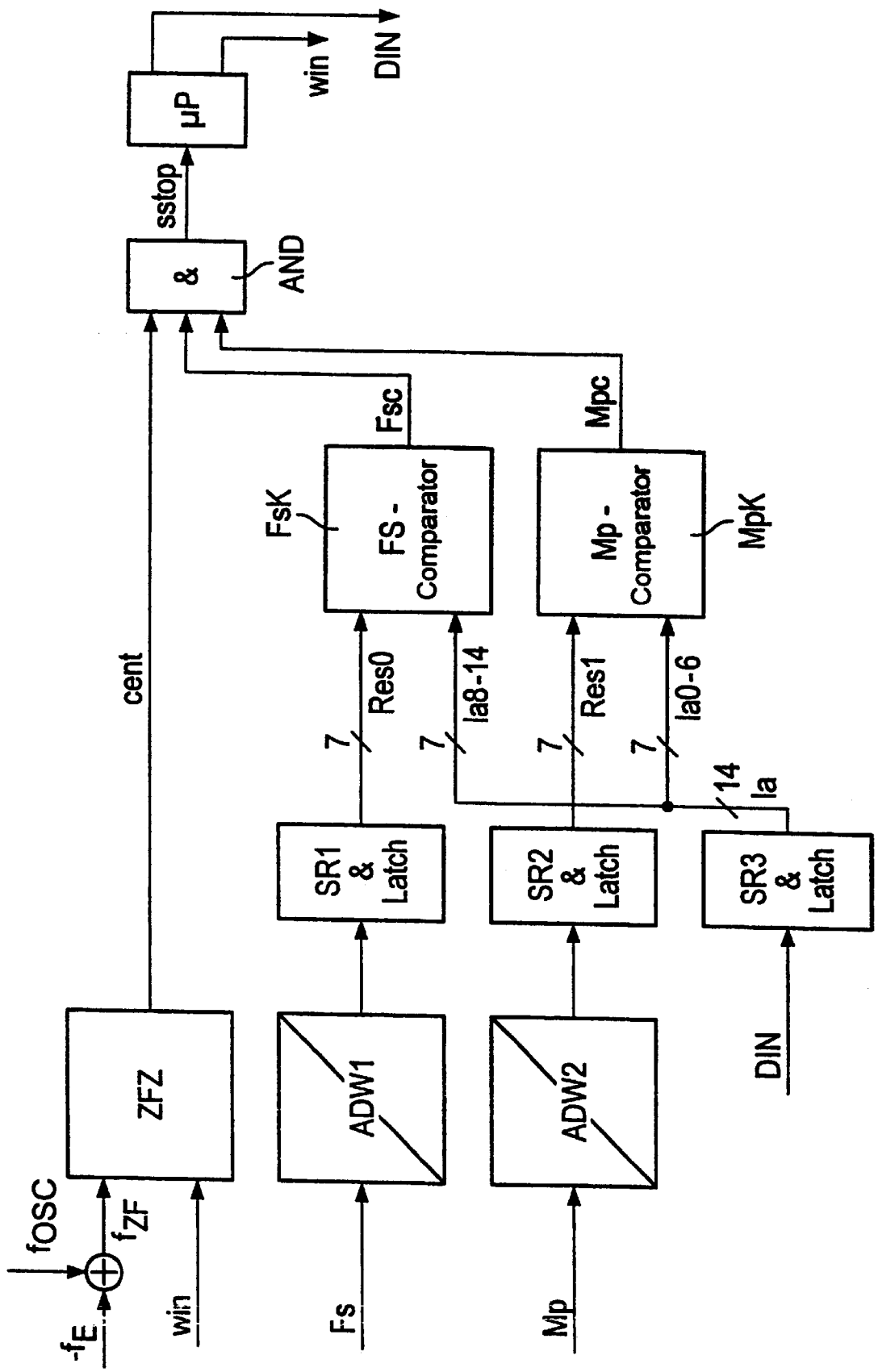

INTEGRATED CIRCUIT FOR DETECTING A RECEIVED SIGNAL AND CIRCUIT CONFIGURATION

CROSS-REFERENCE TO RELATED APPLICATION

This application is a continuation of copending International Application No. PCT/DE00/01644, filed May 23, 2000, which designated the United States.

BACKGROUND OF THE INVENTION

1. Field of the Invention:

The invention relates to an integrated circuit for detecting a received signal, which can be used, for example, in radio receivers and in particular in mobile radio receivers, as well as a circuit configuration with an integrated circuit.

Voltage-controlled oscillators (VCO) which are tuned with a phase locked loop (PLL) have become established in radio reception technology. The oscillator frequency of the voltage-controlled oscillator is tuned using the phase locked loop with a specific step size, for example with a frequency step size of 100 KHz in frequency-modulated radio in Europe. During the transmitter search run, the entire FM band (87.5 MHz to 108 MHz) is preferably scanned in 100 KHz increments. The oscillator frequency of the voltage-controlled oscillator fOSC is typically 10.7 MHz above the input frequency to be received, that is to say between 98.2 MHz and 118.7 MHz.

During the transmitter search run, as far as possible all the transmitters which are worth receiving are to be found and their input frequency or the corresponding oscillator frequency fOSC of the voltage-controlled oscillator are to be stored. If a transmitter is detected at any particular reception frequency, the phase locked loop is stopped at the a instantaneous value by the microcontroller. The corresponding values are stored in the microcontroller so that these transmitter stations which are determined can be set directly at a later time. In order to be able to detect the transmission stations, one or—for sake of increased detection precision—a plurality of criteria are required in order to stop the voltage-controlled oscillator at the corresponding oscillator frequency. It is therefore necessary to use one, or preferably a plurality of, evaluation criteria in the receiver in order to to detect unambiguously the presence of an input signal which is worth receiving.

In order to increase the reliability with which a transmitter can be detected unambiguously, it is possible to use not only the field-strength signal (level of the received signal) but also the multipath signal which indicates whether the received signal is scattered by multipath reception. To do this, the field-strength signal and the multipath signal are fed to a microprocessor which digitizes these signals and evaluates them through the use of criteria which are predefined in the microprocessor. Finally, in the microprocessor it is decided whether the transmitter is one which is worth receiving. The disadvantage of such a circuit configuration is that a plurality of lines are required from the receiver module to the microprocessor and unavoidable data traffic occurs on the data bus during the transmitter search run. However, this not only unnecessarily severely loads the microprocessor but the data traffic also constitutes a permanent source of interference in the sensitive reception system. In order to keep the data traffic as low as possible, the transmitter search criterion of intermediate frequency counting is therefore frequently not included, which however has the disadvantage of less precise transmitter identification. In many cases, for a more reliable search run stop it is not sufficient to evaluate only one of the search run stop criteria including the field-strength signal, multipath signal, zero crossover of the S curve and the limited intermediate frequency transmitted from the input mixer to the intermediate frequency amplifier. It is difficult to reliably detect weakly receivable transmitters only through the use of the field-strength.

European Patent Application No. EP 0 430 469 A2 discloses a circuit for detecting a received signal for FM receivers. The detector contains an intermediate frequency detector, a field-strength comparator and a noise signal detector whose output signals are combined with one another in a logic switching element to form a signal path. A microprocessor is driven as a function of this.

Patent Abstracts of Japan, Volume 009, No. 248 (E-347), Oct. 4, 1985 (JP-A-60-096913) discloses how to use a noise detector to detect noise on the basis of multipath signals.

European Patent Application No. EP 0 335 141 A2 discloses a configuration for detecting various reception characteristic variables including a multipath reception, the outputs of which are coupled to a logic element.

SUMMARY OF THE INVENTION

It is accordingly an object of the invention to provide an integrated circuit for detecting a received signal which overcomes the above-mentioned disadvantages of the heretofore-known circuits of this general type and which permits a transmitter identification as quickly and reliably as possible while avoiding interference.

With the foregoing and other objects in view there is provided, in accordance with the invention, in combination with a microprocessor, an integrated circuit for detecting a received signal, including:

an intermediate frequency detector configured to detect an intermediate frequency and supplying a first search run stop signal if the intermediate frequency is within a given range;

a field-strength comparator configured to supply a second search run stop signal if a field-strength of the received signal exceeds a field-strength setpoint value;

a multipath comparator configured to supply a third search run stop signal if a multipath signal exceeds a given multipath setpoint valve;

a logic component operatively connected to the intermediate frequency detector, the field-strength comparator, and the multipath comparator, the logic component logically combining the first, second and third search run stop signals with one another and forming a binary stop signal, the logic component having an output and providing the binary stop signal as a statically present signal at the output of the logic component, and the microprocessor receiving, as an input signal, the binary stop signal provided at the output of the logic component;

a first analog/digital converter connected upstream of the field-strength comparator, the first analog/digital converter digitizing a field-strength signal;

a first serial/parallel converter connected between the first analog/digital converter and the field-strength comparator;

a second analog/digital converter connected upstream of the multipath comparator, the second analog/digital converter digitizing the multipath signal; and a second serial/parallel converter connected between the second analog/digital converter and the multipath comparator.

In other words, the integrated circuit according to the invention for detecting a received signal has an intermediate frequency detector which supplies a first search run stop signal if the intermediate frequency lies within a specific range. Furthermore, the integrated circuit has a field-strength comparator which supplies a second search run stop signal if the field-strength of the received signal exceeds a field-strength setpoint value. The invention additionally has a multipath comparator which supplies a third search run stop signal if the multipath signal exceeds a specific multipath setpoint value. Furthermore, a logic component is provided which logically combines the three search run stop signals with one another to form a binary stop signal which is statically present at the output of the logic component and is made available to a microprocessor as its input signal.

The data traffic between the microprocessor and the integrated circuit is reduced, which results in a severe reduction in interference.

The integrated circuit has the advantage that the overall space required for the radio receiver can be reduced as a result of the integration of a first analog/digital converter, which is connected upstream of the field-strength comparator and serves to digitize the field-strength signal, into the integrated circuit. Likewise, the external electrical lines, which therefore run outside the integrated circuit, can therefore be reduced, which also reduces the susceptibility to interference.

A second analog/digital converter which is connected upstream of the multipath comparator and which serves to digitize the multipath signal also entails the aforementioned advantages.

The integrated circuit has the advantage that accelerated signal processing is possible in the field-strength comparator by virtue of a first serial/parallel converter which is connected between the first analog/digital converter and the field-strength comparator.

This advantage also applies if a second serial/parallel converter is connected between the second analog/digital converter and the multipath comparator.

According to another feature of the invention, the integrated circuit can advantageously be adapted to the ambient conditions by setting the field-strength setpoint value and the multipath setpoint value to lower values in areas or conditions with weak reception than in areas or conditions with strong reception, so that rapid transmitter signal detection is still possible.

In an advantageous embodiment of the integrated circuit according to the invention, the field-strength setpoint value, the multipath setpoint value and the range within which the intermediate frequency is to lie are determined by the microprocessor. This permits a flexible, rapid and simple adaptation of the setpoint values to the ambient conditions without the computing capacity of the microprocessor being appreciably restricted thereby.

According to another feature of the invention, a third serial/parallel converter having an output side coupled to the field-strength comparator and to the multipath comparator is provided, the third serial/parallel converter receiving the field-strength setpoint value and the multipath setpoint value in a serial manner.

With the objects of the invention in view there is also provided, a circuit configuration, including:

a microprocessor having a microprocessor input terminal and at least one microprocessor output terminal, the microprocessor input terminal having a single line; and
a detection circuit including:
  at least one detection circuit input terminal;
  a detection circuit output terminal connected to the single line of the microprocessor input terminal;
  an intermediate frequency detector configured to detect an intermediate frequency and supplying a first search run stop signal if the intermediate frequency is within a given range;
  a field-strength comparator configured to supply a second search run stop signal if a field-strength of a received signal exceeds a field-strength setpoint value;
  a multipath comparator configured to supply a third search run stop signal if a multipath signal exceeds a given multipath setpoint valve;
  a logic component operatively connected to the intermediate frequency detector, the field-strength comparator, and the multipath comparator, the logic component logically combining the first, second and third search run stop signals with one another and forming a binary stop signal as a statically present output signal, the logic component providing the binary stop signal to the detection circuit output terminal, the at least one microprocessor output terminal being connected to the at least one detection circuit input terminal for transmitting the field-strength setpoint value and the multipath setpoint value as a serial data word, and the given range within which the intermediate frequency is to be;
  a first analog/digital converter connected upstream of the field-strength comparator, the first analog/digital converter digitizing a field-strength signal;
  a first serial/parallel converter connected between the first analog/digital converter and the field-strength comparator;
  a second analog/digital converter connected upstream of the multipath comparator, the second analog/digital converter digitizing the multipath signal; and
  a second serial/parallel converter connected between the second analog/digital converter and the multipath comparator.

In other words, a circuit configuration according to the invention includes an integrated circuit and a microprocessor in which the integrated circuit has an output terminal for the binary stop signal which is connected to an input terminal of the microprocessor which includes a single line and in which the microprocessor has at least one output terminal which is connected to at least one input terminal of the integrated circuit in order to transmit over it the field-strength setpoint value and the multipath signal value as a serial data word, and the range within which the intermediate frequency is to lie.

Other features which are considered as characteristic for the invention are set forth in the appended claims.

Although the invention is illustrated and described herein as embodied in an integrated circuit for detecting a received signal and a corresponding circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE is a circuit block diagram of a circuit configuration including an integrated circuit for detecting a received signal according to the invention.

DESCRIPTION OF THE PREFERRED EMBODIMENTS

Referring now to the single FIGURE, there is shown a block diagram of an exemplary embodiment of the invention which contains the essential components for the transmitter search run. An intermediate frequency counter ZFZ is used to detect whether the intermediate frequency fZF which is present at the intermediate frequency counter ZFZ and which is the difference between the oscillator frequency fOSC and the reception frequency fE of the received signal lies within a predetermined range win. The range win constitutes a setpoint value which can be predefined as a function of the desired precision, for example through the use of the microprocessor μP. The range win defines within which range the intermediate frequency fZF can lie in order to be detected as a transmit signal which is associated with a transmitter.

At the output of the intermediate frequency counter ZFZ there is a first search run stop signal cent which can have two different logic states. A search run stop signal cent with a first logic state indicates that an intermediate frequency fZF has been detected within the range win, whereas the search run stop signal cent with the second logic state indicates that no intermediate frequency fZF has been detected within this range win.

In addition to the intermediate frequency detection for detecting transmitters, a field-strength comparator FsK is provided as second criterion for the detection of a received signal. The field-strength comparator FsK compares the field-strength signal Fs digitized by a first analog/digital converter ADW1, which has been subsequently converted into a 7-bit wide data word Res0, with a field-strength setpoint value la8-14 which is also 7-bits wide. The conversion of the serial data word into the parallel 7-bit wide data word Res0 is made by the first serial/parallel converter SR1, which has a shift register and a latch. At the output of the field-strength comparator FsK is scannable a second search run signal Fsc which can also have two logic states, like the first search run stop signal cent. If the second search run stop signal Fsc has a first logic state, this means that the field-strength comparator FsK has detected a received signal, whereas if the second search run stop signal Fsc assumes the second logic state, no received signal has been detected by the field-strength comparator FsK.

A multipath comparator MpK which compares the multipath signal Mp, digitized by the second analog/digital converter ADW2 and fed to the multipath comparator MpK as a 7-bit wide data word Res1, with a multipath setpoint value la0-6 is provided as a third criterion for the detection of the received signal. The conversion of the digitized multipath signal Mp is made by a second serial/parallel converter SR2 which is connected between the second analog/digital converter ADW2 and the multipath comparator MpK. The third search run stop signal Mpc which is generated by the multipath comparator MpK can also have two logic states, a received signal having been detected in the first logic state by the multipath comparator MpK. In the event of the third search run stop signal Mpc assuming the second logic state, no received signal has been detected by the multipath comparator MpK.

The multipath setpoint value and the field-strength setpoint value are read in together as a serial data word DIN into a third serial/parallel converter SR3 and output as a 14-bit wide data word la at the output of the third serial/parallel converter SR3. The first 7 bits of the data word la are made available here as multipath setpoint value la0-6 to the multipath comparator MpK, and the second 7 bits are made available as field-strength setpoint value la8-14 of the field-strength comparator FsK.

The three search run stop signals cent, Fsc and Mpc are logically combined with one another through the use of an AND gate AND and give rise to a stop signal sstop at the output of the AND gate AND, which stop signal sstop constitutes the input signal for the microprocessor μP. The stop signal sstop can assume two logic states here. In the first logic state, a received signal has been detected in each case by the intermediate frequency counter ZFZ, the field-strength comparator FsK and the multipath comparator MpK. If the stop signal sstop assumes the second logic state, no received signal has been detected by one of the three components intermediate frequency counter ZFZ, field-strength comparator FsK or multipath comparator MpK. In this way, the microprocessor μP is informed immediately as to whether a received signal is present. As a result of the fact that the microprocessor μP predefines the range win within which the intermediate frequency must lie and predefines the setpoint values, in the form of a serial data word DIN, with which the field-strength comparator FsK and the multipath comparator MpK compare the field-strength signal Fs and the multipath signal Mp, respectively, these three detectors can each be individually weighted. As a result, their influence on the searching precision can be influenced quickly, easily and precisely. In an environment with a poor reception characteristic, the setpoint values for the field-strength and the multipath signal can be reduced so that as a result adaptation to the ambient conditions is possible. If the setpoint values for the field-strength signal Fs and the multipath signal Mp were set to zero by the serial data word DIN, the two components including the field-strength comparator FsK and multipath comparator MpK would be, as it were, switched off so that only the intermediate frequency counter ZF is used to determine the detection of a received signal.

Of course, the circuit configuration according to the invention is not restricted to 7-bit wide data words Res0, Res1, la0-6 and la8-14. Instead, the data words can be selected such that their width is dependent on requirements.

The invention advantageously permits measurement of a combination of field-strength, multipath and intermediate frequency in such a way that it is possible to indicate through the use of a single bit, and thus through the use of a single pin (housing terminal) whether a received signal which is associated with a transmitter is present.

The two analog/digital converters (ADW1 and ADW2) can be implemented by a two-channel 7-bit analog/digital converter, the field-strength signal Fs being used as received signal for the first channel, and the multipath signal Mp being used as input signal for the second channel.

In the prior art, analog evaluations are usually performed for the field-strength, the multipath signal or the S curve. The analog signals are, for this purpose, fed to the microprocessor and converted there. This leads to a situation in which additional leads with the analog signals have to be led to the microprocessor. If the conversion of the analog signals takes place before they are fed to the microprocessor, the previously generated digital words are to be transmitted to the microprocessor by bus, which leads to intense data traffic between the circuit connected upstream and the microprocessor, and additionally loads the microprocessor with the data transmission and evaluation. In addition, interference signals are generated as a result of this.

In addition to the evaluation of the intermediate frequency fZF, of the field-strength Fs and of the multipath signal Mp, there is additionally the possibility of easily evaluating the zero cross-over of the S curve (=FM–demodulated signal) and also feeding it to the AND gate AND.

In the intermediate frequency counter ZFZ, a known input frequency is counted and correspondingly evaluated within a defined time. The result indicates whether the intermediate frequency (fZF=fOSC−fE) lies within the range or window win provided. The counting time, the center frequency of the intermediate frequency which is to be evaluated and the range win can be set independently of one another. If the measured intermediate frequency fZF lies within the window win, the corresponding state of the first search run stop signal cent is present at the output of the intermediate frequency counter ZFZ. If the measured intermediate frequency fZF lies outside the window win, the first search run stop signal cent with the second logic state is present at the output of the intermediate frequency counter ZFZ. In addition, the intermediate frequency counter ZFZ can be used to indicate whether the frequency fZF to be evaluated is too high or too low.

We claim:

1. In combination with a microprocessor, an integrated circuit for detecting a received signal, comprising:
   at least one detection circuit input terminal for receiving a field-strength setpoint value and a given multipath setpoint value as a serial data word, and a given range for an intermediate frequency;
   an intermediate frequency detector configured to detect the intermediate frequency and supplying a first search run stop signal if the intermediate frequency is within the given range;
   a field-strength comparator configured to supply a second search run stop signal if a field-strength of the received signal exceeds the field-strength setpoint value;
   a multipath comparator configured to supply a third search run stop signal if a multipath signal exceeds the given multipath setpoint value;
   a logic component operatively connected to said intermediate frequency detector, said field-strength comparator, and said multipath comparator, said logic component logically combining the first, second and third search run stop signals with one another and forming a binary stop signal, said logic component having an output and providing the binary stop signal as a statically present signal at said output of said logic component, and the microprocessor receiving, as an input signal, the binary stop signal provided at said output of said logic component;
   a first analog/digital converter connected upstream of said field-strength comparator, said first analog/digital converter digitizing a field-strength signal;
   a first serial/parallel converter connected between said first analog/digital converter and said field-strength comparator;
   a second analog/digital converter connected upstream of said multipath comparator, said second analog/digital converter digitizing the multipath signal;
   a second serial/parallel converter connected between said second analog/digital converter and said multipath comparator; and
   a third serial/parallel converter having a first portion of output bits connected to said multipath comparator for providing the multipath setpoint value and a second portion of output bits connected to said field-strength comparator for providing the field-strength setpoint value.

2. The integrated circuit according to claim 1, wherein said field-strength comparator and said multipath comparator are respectively configured to operate such that the field-strength setpoint value and the multipath setpoint value are set to relatively lower values in case of relatively weaker reception conditions and are set to relatively higher values in case of relatively stronger reception conditions.

3. The integrated circuit according to claim 2, wherein the microprocessor determines the field-strength setpoint value, the multipath setpoint value and the given range within which the intermediate frequency is to be.

4. A circuit configuration, comprising:
   a microprocessor having a microprocessor input terminal and at least one microprocessor output terminal, said microprocessor input terminal having a single line; and
   a detection circuit including:
      at least one detection circuit input terminal;
      a detection circuit output terminal connected to said single line of said microprocessor input terminal;
      an intermediate frequency detector configured to detect an intermediate frequency and supplying a first search run stop signal if the intermediate frequency is within a given range;
      a field-strength comparator configured to supply a second search run stop signal if a field-strength of a received signal exceeds a field-strength setpoint value;
      a multipath comparator configured to supply a third search run stop signal if a multipath signal exceeds a given multipath setpoint value;
      a logic component operatively connected to said intermediate frequency detector, said field-strength comparator, and said multipath comparator, said logic component logically combining the first, second and third search run stop signals with one another and forming a binary stop signal as a statically present output signal, said logic component providing the binary stop signal to said detection circuit output terminal, said at least one microprocessor output terminal being connected to said at least one detection circuit input terminal for transmitting the field-strength setpoint value and the multipath setpoint value as a serial data word, and the given range within which the intermediate frequency is to be;
      a first analog/digital converter connected upstream of said field-strength comparator, said first analog/digital converter digitizing a field-strength signal;
      a first serial/parallel converter connected between said first analog/digital converter and said field-strength comparator;
      a second analog/digital converter connected upstream of said multipath comparator, said second analog/digital converter digitizing the multipath signal;
      a second serial/parallel converter connected between said second analog/digital converter and said multipath comparator; and
      a third serial/parallel converter having a first portion of output bits connected to said multipath comparator for providing the multipath setpoint value and a second portion of output bits connected to said field-strength comparator for providing the field-strength setpoint value.

5. In combination with a microprocessor, an integrated circuit for detecting a received signal, comprising:
   an intermediate frequency detector configured to detect an intermediate frequency and supplying a first search run stop signal if the intermediate frequency is within a given range;

a field-strength comparator configured to supply a second search run stop signal if a field-strength of the received signal exceeds a field-strength setpoint value;

a multipath comparator configured to supply a third search run stop signal if a multipath signal exceeds a given multipath setpoint value;

said field-strength comparator and said multipath comparator being respectively configured to operate causing the field-strength setpoint value and the multipath setpoint value to be set to relatively lower values upon relatively weaker reception conditions and to be set to relatively higher values upon relatively stronger reception conditions;

a logic component operatively connected to said intermediate frequency detector, said field-strength comparator, and said multipath comparator, said logic component logically combining the first, second and third search run stop signals with one another and forming a binary stop signal, said logic component having an output and providing the binary stop signal as a statically present signal at said output of said logic component, and the microprocessor receiving, as an input signal, the binary stop signal provided at said output of said logic component;

a first analog/digital converter connected upstream of said field-strength comparator, said first analog/digital converter digitizing a field-strength signal;

a first serial/parallel converter connected between said first analog/digital converter and said field-strength comparator;

a second analog/digital converter connected upstream of said multipath comparator, said second analog/digital converter digitizing the multipath signal; and a second serial/parallel converter connected between said second analog/digital converter and said multipath comparator.

6. A circuit configuration, comprising:

a microprocessor having a microprocessor input terminal and at least one microprocessor output terminal, said microprocessor input terminal having a single line; and a detection circuit including:
 at least one detection circuit input terminal;
 a detection circuit output terminal connected to said single line of said microprocessor input terminal;
 an intermediate frequency detector configured to detect an intermediate frequency and supplying a first search run stop signal if the intermediate frequency is within a given range;
 a field-strength comparator configured to supply a second search run stop signal if a field-strength of a received signal exceeds a field-strength setpoint value;
 a multipath comparator configured to supply a third search run stop signal if a multipath signal exceeds a given multipath setpoint value;
 said field-strength comparator and said multipath comparator being respectively configured to operate causing the field-strength setpoint value and the multipath setpoint value to be set to relatively lower values upon relatively weaker reception conditions and to be set to relatively higher values upon relatively stronger reception conditions;
 a logic component operatively connected to said intermediate frequency detector, said field-strength comparator, and said multipath comparator, said logic component logically combining the first, second and third search run stop signals with one another and forming a binary stop signal as a statically present output signal, said logic component providing the binary stop signal to said detection circuit output terminal, said at least one microprocessor output terminal being connected to said at least one detection circuit input terminal for transmitting the field-strength setpoint value and the multipath setpoint value as a serial data word, and the given range within which the intermediate frequency is to be;
 a first analog/digital converter connected upstream of said field-strength comparator, said first analog/digital converter digitizing a field-strength signal;
 a first serial/parallel converter connected between said first analog/digital converter and said field-strength comparator;
 a second analog/digital converter connected upstream of said multipath comparator, said second analog/digital converter digitizing the multipath signal; and
 a second serial/parallel converter connected between said second analog/digital converter and said multipath comparator.

* * * * *